United States Patent [19]

Mathews et al.

[11] Patent Number: 5,202,278
[45] Date of Patent: Apr. 13, 1993

[54] METHOD OF FORMING A CAPACITOR IN SEMICONDUCTOR WAFER PROCESSING

[75] Inventors: Viju K. Mathews; Chang Yu; Mark E. Tuttle; Trung T. Doan, all of Boise, Id.

[73] Assignee: Micron Technology, Inc., Boise, Id.

[21] Appl. No.: 757,197

[22] Filed: Sep. 10, 1991

[51] Int. Cl.$^5$ .................... H01L 21/265; H01L 21/70
[52] U.S. Cl. .......................................... 437/47; 437/52; 437/60; 437/919
[58] Field of Search ................... 437/19, 173, 20, 977, 437/942, 47, 60, 52, 919; 357/23.6; 365/149, 51

[56] References Cited

U.S. PATENT DOCUMENTS

| | | | |
|---|---|---|---|
| 4,782,029 | 11/1988 | Takemura et al. | 437/19 |
| 5,043,780 | 8/1991 | Fazan et al. | 357/23.6 |
| 5,079,187 | 1/1992 | Asmus et al. | 437/942 |
| 5,091,761 | 2/1992 | Hiraiwa et al. | 357/51 |
| 5,112,773 | 5/1992 | Tuttle | 437/977 |

FOREIGN PATENT DOCUMENTS

| | | | |
|---|---|---|---|
| 0427200 | 5/1991 | European Pat. Off. | 365/149 |
| 3929129 | 4/1990 | Fed. Rep. of Germany | 365/149 |
| 2-265267 | 10/1990 | Japan | 437/52 |

OTHER PUBLICATIONS

Sze "VLSI Technology", second edition, McGraw Hill Comp. New York 1988, pp. 238-245.

Geis et al., "Silicon Graphoepitaxy Using Strip Heater Oven", Appl. Phys. Lett. 37(5), Sep. 1, 1980, pp. 454-456.

T. Mine et al., "Capacitance-Enhanced Stacked-Capacitor with Engraved Storage Electrode for Deep Submicron DRAMs", Extended Abstracts of the 21st Conference on Solid State Devices and Materials, Tokyo, pp. 137-140, 1989.

H. Wantanabe et al., "A New Stacked Capacitor Structure Using Hemispherical-Grain (HSG) Poly-Silicon Electrodes", Ext. Abstracts of the 22nd (1990 International) Conf. on Solid State Devices and Materials, Sendai, pp. 873-876, 1990.

Hayashide et al., "Fabrication of Storage Capacitance-Enhanced Capacitors with a Rough Electrode", Extended Abstracts of the 22nd Conference on Solid State Devices and Materials, Sendai, pp. 869-872, 1990.

Fazan et al., "Thin Nitride Films on Textured Polysilicon to Increase Multimegabit DRAM Cell Charge Capacity", IEEE Electron Device Letters, vol. 11, No. 7, Jul. 1990.

Fazan et al., "Electrical Characterization of Textured Interpoly Capacitors for Advanced Stacked DRAMs", IEDN Tech. Digest, 1990.

Primary Examiner—Olik Chaudhuri
Assistant Examiner—Loc Q. Trinh
Attorney, Agent, or Firm—Wells, St. John, Roberts, Gregory & Matkin

[57] ABSTRACT

A method of forming a capacitor in semiconductor water processing comprising the following steps: a) providing a conductively doped first layer of polysilicon atop a silicon wafer to a first thickness; b) depositing an undoped second layer of polysilicon over the conductively doped first layer of polysilicon to a second thickness, the layer of undoped polysilicon being deposited at a deposition temperature of at least 590° and having an upper surface; c) impinging laser energy onto the upper surface of the second polysilicon layer at a laser fluence of 0.3 J/cm$^2$ or greater to roughen the upper surface and thereby increase the capacitance of the second polysilicon layer; d) patterning and etching the first and second polysilicon layers to define a lower capacitor plate; e) providing a layer of capacitor dielectric atop the roughened second polysilicon layer upper surface; and f) providing a layer of conductive material atop the capacitor dielectric to define an upper capacitor plate.

24 Claims, 3 Drawing Sheets

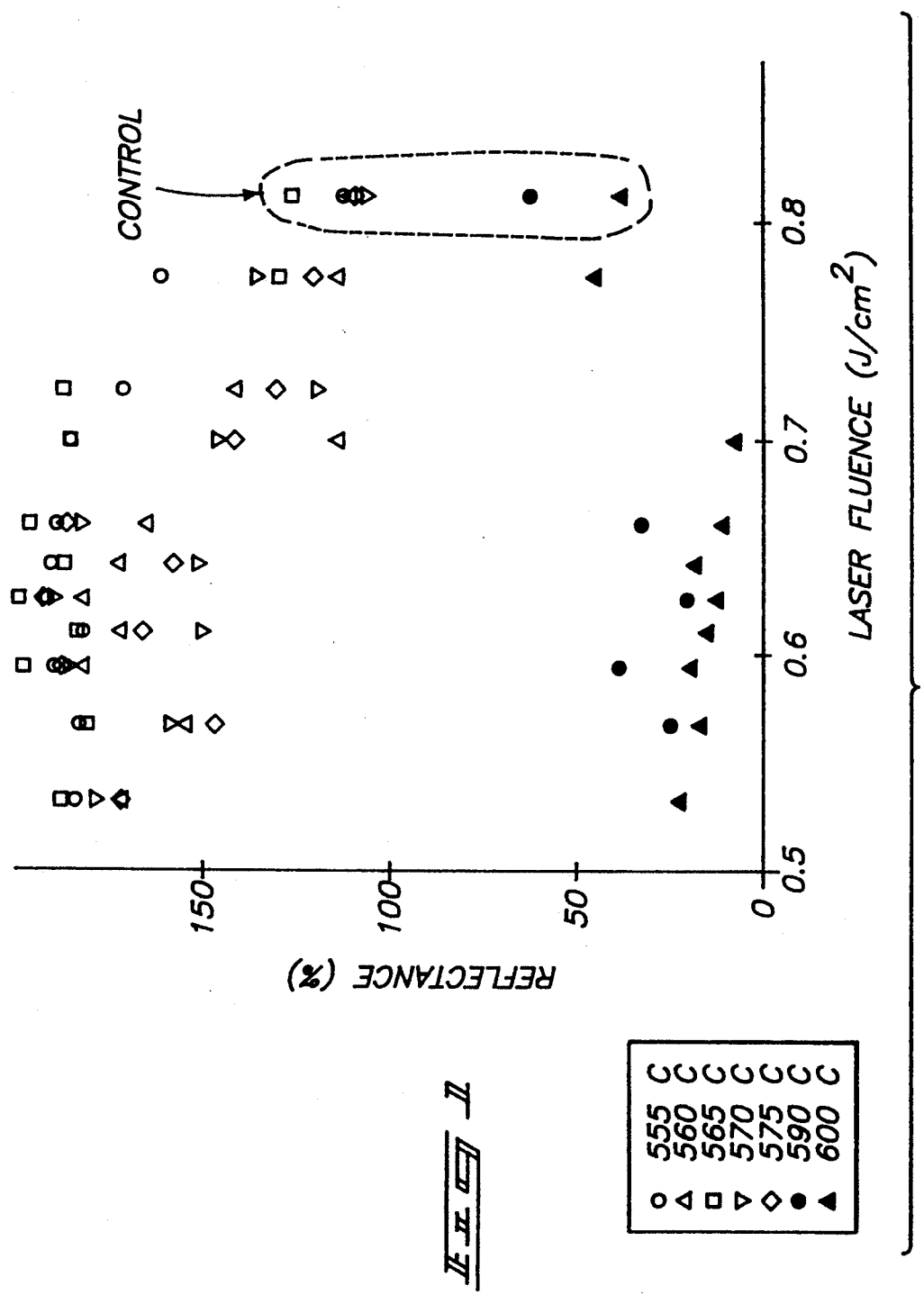

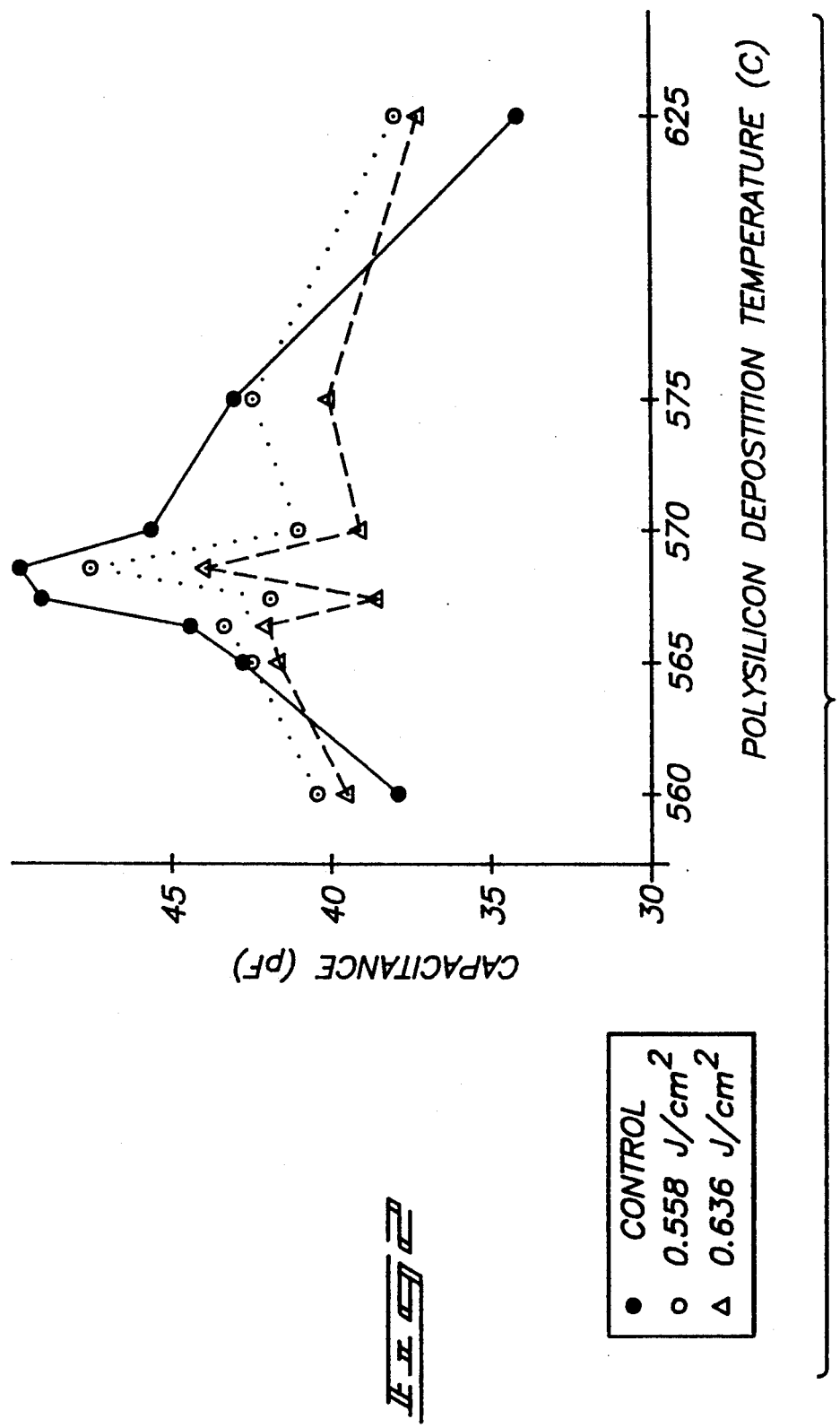

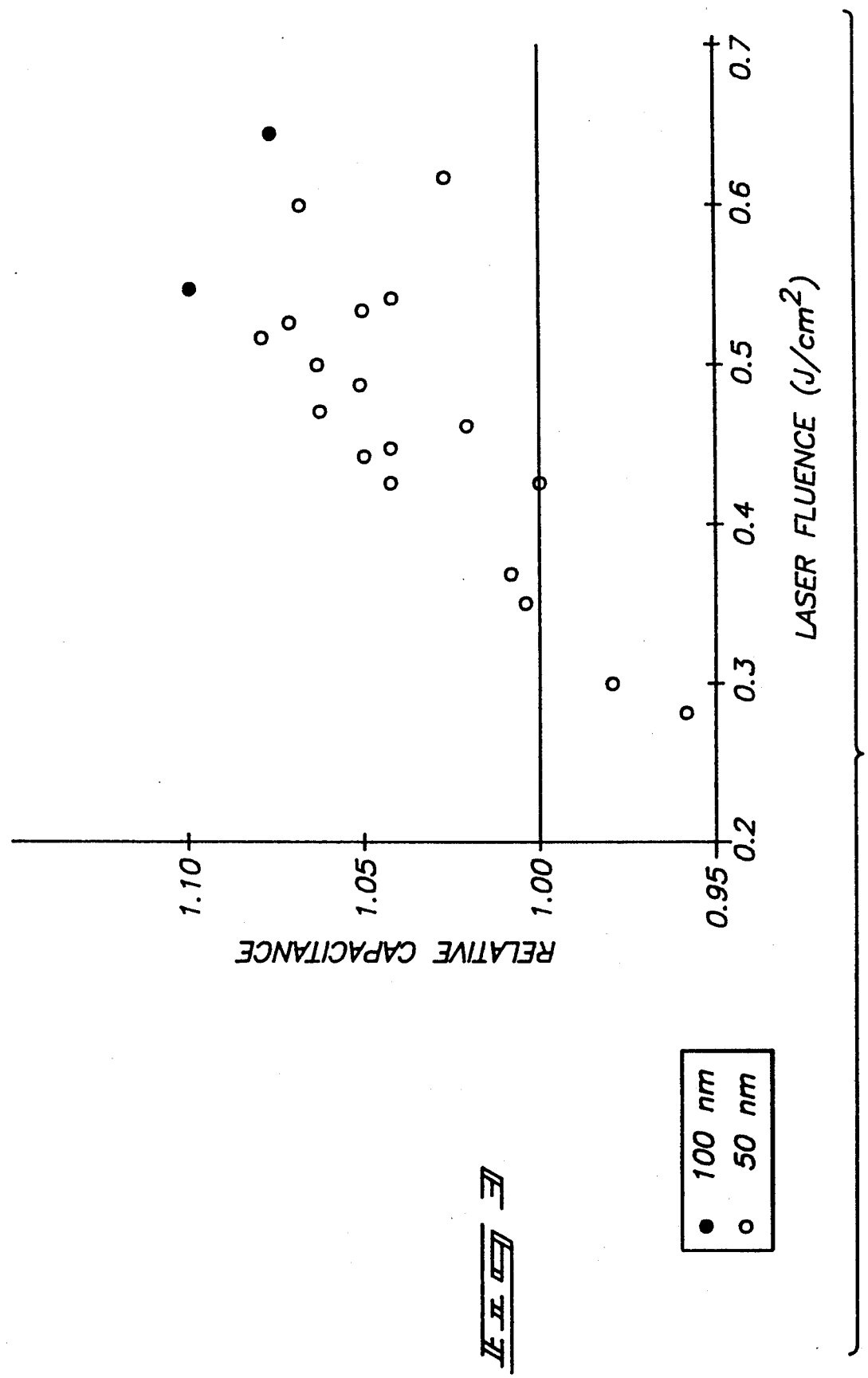

5,202,278

METHOD OF FORMING A CAPACITOR IN SEMICONDUCTOR WAFER PROCESSING

TECHNICAL FIELD

This invention relates generally to capacitor formation in semiconductor wafer processing. More particularly, this invention relates to surface roughening of polysilicon films for increasing capacitance.

BACKGROUND OF THE INVENTION

As DRAMs increase in memory cell density, there is a continuous challenge to maintain a sufficiently high storage capacitance despite decreasing cell area. It is important that storage node capacitor cell plates be large enough to retain an adequate charge or capacitance in spite of parasitic capacitances and noise which may be present during circuit operation. The principal way of retaining high cell capacitance with increasing cell density is through cell structure techniques. Such techniques include three dimensional cell capacitors, such as trenched or stacked capacitors.

One way of increasing capacitance is to roughen the interfacing surfaces of the capacitor, thereby maximizing the area for stored capacitance. Such techniques are shown by way of example in T. Mine et al., "Capacitance-Enhanced Stacked-Capacitor with Engraved Storage Electrode for Deep Submicron DRAMs", taken from Extended Abstracts of the 21st Conference on Solid State Devices and Materials, Tokyo, pp. 137–140, 1989; H. Watanabe et al., "A New Stacked Capacitor Structure Using Hemispherical-Grain (HSG) Poly-Silicon Electrodes", taken from Extended Abstracts of the 22nd (1990 International) Conference on Solid State Devices and Materials, Sendai, pp. 873–876, 1990; Hayashide et al., "Fabrication of Storage Capacitance-Enhanced Capacitors with a Rough Electrode" taken from Extended Abstracts of the 22nd (1990 International) Conference on Solid State Devices and Materials, Sendai, pp. 869–872; Fazan et al., "Thin Nitride Films on Textured Polysilicon to Increase Multimegabit DRAM Cell Charge Capacity", taken from IEEE Electron Device Letters, Vol. 11, No. 7, Jul. 7, 1990; and Fazan et al., "Electrical Characterization of Textured Interpoly Capacitors For Advanced Stacked DRAMs". No admission is made as to whether each of these documents is prior art to this submission.

One common material utilized as one of the opposing capacitor plates is polysilicon which has been implanted with a material to make it conductive, i.e. it is conductively doped. It would be desirable in semiconductor wafer processing to develop improved methods of forming capacitors which have at least one polysilicon plate, and which include improved methods for roughening such polysilicon plate to maximize its surface area and thereby the resultant capacitance of the finished construction.

BRIEF DESCRIPTION OF THE DRAWINGS

One or more preferred embodiments of the invention are described with reference to the accompanying drawings, which are briefly described below.

Experimental data taken by the inventors are shown in FIGS. 1–3, where FIG. 1 is a graphical depiction of polysilicon film reflectance versus laser fluence for polysilicon films deposited at various temperatures.

FIG. 2 is a graphical depiction of capacitance versus polysilicon deposition temperature for polysilicon films subjected to no and varying laser processing.

FIG. 3 is a graphical depiction of relative capacitance versus laser fluence for different thickness polysilicon films treated in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a capacitor in semiconductor wafer processing comprises the following steps:

providing a conductively doped first layer of polysilicon atop a silicon wafer to a first thickness;

depositing an undoped second layer of polysilicon over the conductively doped first layer of polysilicon to a second thickness, the layer of undoped polysilicon being deposited at a deposition temperature of at least 590° and having an upper surface;

impinging laser energy onto the upper surface of the second polysilicon layer at a laser fluence of 0.3 J/cm$^2$ or greater to roughen the upper surface and thereby increase the capacitance of the second polysilicon layer;

patterning and etching the first and second polysilicon layers to define a lower capacitor plate;

providing a layer of capacitor dielectric atop the roughened second polysilicon layer upper surface; and providing a layer of conductive material atop the capacitor dielectric to define an upper capacitor plate.

The first thickness of the conductively doped first layer of polysilicon is preferably from about 100 Angstroms to about 1000 Angstroms. Typically during the process, the thickness of the first layer of polysilicon will be diminished. This is caused by the typical thermal diffusion step which is conducted to provide a conductivity enhancing impurity into the polysilicon. Such step can oxidize several hundred Angstroms of the upper polysilicon surface. In such instance, the oxide would be stripped before depositing the second polysilicon layer. It is the finished or resulting first layer of polysilicon (post-oxide strip) atop which the second layer is deposited which preferably has the first thickness from about 100 Angstroms to about 1000 Angstroms. Additionally, the first polysilicon layer is preferably deposited at a deposition temperature of at least 600° C. Such deposition produces polycrystalline silicon having columnar grain boundaries which facilitates conductivity impurity doping.

The second thickness of the undoped second layer of polysilicon is preferably from about 500 Angstroms to 1500 Angstroms, providing a preferred composite polysilicon layer ranging from about 600 Angstroms to about 2500 Angstroms.

The preferred step for impinging laser energy onto the upper surface of the second polysilicon layer is conducted at a laser fluence of 0.5 J/cm$^2$, with a range of 0.3 J/cm$^2$ through 0.8 J/cm$^2$ believed to be most preferred. The laser energy is preferably impinged in pulsed bursts of about 25 nanoseconds duration. The preferred laser is an excimer laser. The invention was reduced to practice utilizing a XeCl excimer laser.

EXAMPLES

The substrates utilized in the following described examples were 150 mm, p-type (100) silicon wafers. The capacitor constructions were created utilizing polysilicon for the capacitor plates. An insulating layer of PECVD oxide was used between the substrate and the capacitor structures. The polysilicon films of the capacitor plates were deposited in an LPCVD reactor at a pressure of 80 mtorr. The storage (lower) plate was deposited at temperatures ranging from 550° C. to 625° C., and the top plate was deposited at 625° C. An 8 nm reoxidized nitride film was utilized as the cell dielectric. Texturization of the first or lower polysilicon film was carried out using a XeCl (308 nm wavelength) excimer laser with an energy of approximately 500 mJ/pulse and a pulse duration of approximately 25 nanoseconds. The laser fluence, defined as the laser energy per unit area ($J/cm^2$), was controlled by varying the laser spot size. The spot size was typically varied from 6.7 mm to 8.0 mm.

The surface texture of the polysilicon film before and after laser processing was examined by scanning electron microscopy. Reflectance at a wavelength of 480 nm was used to quantify the surface roughness of the films. Capacitance-voltage measurements on $6.5 \times 10^{-5}$ $cm^2$ structures were used for evaluating the cell capacitance.

It was observed that laser processing results in the generation of a surface texture consisting of small globules connected in a grain-like structure. Generally, the higher the fluence the greater the size of the globules.

The change in reflectance of undoped polysilicon films as a function of the laser fluence during processing is illustrated in FIG. 1. Film reflectance was determined to be a good indicator of surface roughness and correspondingly an inverse indicator of capacitance. The untreated control films are those within the dashed circle on the graph. Such received no laser processing, yet the reflectance of such films are illustrated by the relative positioning on the graph with respect to the vertical or y-axis. As is apparent, there was an increase in reflectance after laser processing for films deposited in the 550° C. to 575° C. temperature range. Such indicates an actual smoothing of the treated films for polysilicon deposited at these temperature, rather than the desired roughness. In the case of the higher temperature deposited films (590° C., 600° C.), there was a marked decrease in the reflectance values, indicating increased surface roughness.

The silicon deposition temperature used for the above-described tests corresponds to the amorphous-to-polycrystalline transition region for deposited silicon. Films deposited under these conditions are expected to exhibit the changes in the surface roughness associated with this transition. Accordingly, those films deposited in the 550° C. to 575° C. range are inherently rougher than those deposited at the 590° C. to 600° C. range. The results indicate that rougher films treated with laser processing at these lower deposition temperatures become smoother, whereas smoother surfaces deposited at the higher temperatures become rougher.

Based on the reflectance results from the above tests, laser fluences of 0.558 $J/cm^2$ and 0.636 $J/cm^2$ were used to further investigate the changes in the surface roughness of polysilicon films in terms of cell capacitance measurements. The polysilicon films for such tests were also deposited at various temperatures ranging from 560° C. to 625° C. The effect of the polysilicon deposition temperature and laser fluence on the cell capacitance is illustrated by FIG. 2.

The changes in cell capacitance with laser fluence for polysilicon films deposited at 625° C. are shown in FIG. 3. The "Relative Capacitance" on the y-axis reports the ratio of treated capacitance over untreated capacitance. The highest gain in capacitance for a 50 nm film was eight per cent. The thickness of the film is also seen to have an affect on the surface texture after laser processing, as indicated by the data points for the 100 nm film. The results further indicate that laser fluences at less than 0.3 $J/cm^2$ do not provide an increase in capacitance, and actually provide a decrease in capacitance.

Capacitance was also investigated relative to doped and undoped polysilicon films. It was determined that a film deposited at 625° C. and thereafter thermally doped (diffusion) with phosphorus at 850° C., when treated with laser processing, actually resulted in a decrease in capacitance. This is believed to be due to the fact that diffusion doping of polysilicon inherently results in increased roughness. The resultant laser processing of the rougher film results in a smoothing effect.

From the above discoveries, a capacitor in accordance with one aspect of the invention could be formed by first providing a conductively doped first layer of polysilicon atop a wafer. Thereafter, an undoped second layer of polysilicon could be applied at a deposition temperature of at least 590° C. Laser energy would be applied to the second layer at a laser fluence of 0.3 $J/cm^2$ or greater to roughen the upper surface of the second layer and thereby increase capacitance of the second polysilicon layer. The composite first and second polysilicon layers would then be patterned and etched to define a lower capacitor plate having a roughened upper surface. A capacitor dielectric would be applied atop the roughened upper surface, with the polysilicon roughness being transferred to the dielectric layer. Thereafter, a layer of conductive material would be applied atop the roughened dielectric which will produce a roughened interface therebetween. The layer of conductive material will define an upper capacitor plate.

In accordance with another aspect of the invention, a method of forming a capacitor in semiconductor wafer processing comprises the following steps:

depositing a layer of polysilicon atop a wafer to a thickness from 500 Angstroms to 1000 Angstroms and at a deposition temperature of at least 590° C., the layer of polysilicon having an upper surface;

impinging laser energy onto the upper surface of polysilicon at a laser fluence of 0.3 $J/cm^2$ or greater to roughen the upper surface and thereby increase the capacitance of the polysilicon layer;

ion implanting a conductivity enhancing material through the roughened upper polysilicon surface to impart conductivity to the polysilicon layer;

patterning and etching the polysilicon layer to define a lower capacitor plate;

providing a layer of capacitor dielectric atop the roughened polysilicon layer upper surface; and providing a layer of conductive material atop the capacitor dielectric to define an upper capacitor plates.

Preferably the laser energy is impinged in pulse bursts of about 25 nanoseconds duration using an XeCl excimer laser. The most preferred fluence would be at 0.5 $J/cm^2$ or greater.

Such an alternate method provides a way of roughening a single layer of polysilicon, followed by providing a conductive impurity therein by ion implantation. The intent would be to select a species and ion implantation energy in such a way that the texture of the upper surface of polysilicon after it has been roughened by laser processing is not impacted significantly by the implant. Generally, lower energy implants tend to implant very shallow, whereas higher energy implants tend to implant deeper. Shallow implants could adversely affect the surface roughness causing smoothness. Accordingly, higher energy implants are probably more desirable in providing the dopant impurity to impart conductivity. Such would be readily recognized and determinable by routine experimentation by a person of skill in the art. An example dopant material and method would be phosphorus implanted at an energy of 30 kev, which would not adversely impact the roughness of the exposed polysilicon film.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a capacitor in semiconductor wafer processing comprising the following steps:
   providing a conductively doped first layer of polysilicon atop a silicon wafer to a first thickness;
   depositing an undoped second layer of polysilicon over the conductively doped first layer of polysilicon to a second thickness, the layer of undoped polysilicon being deposited at a deposition temperature of at least 590° and having a smooth upper surface, said upper surface being smoother than upper surfaces of polysilicon layers deposited at temperatures less than 590° C.;
   impinging laser energy onto the upper surface of the second polysilicon layer at a laser fluence of 0.3 J/cm$^2$ or greater to roughen the smooth upper surface and thereby increase the capacitance of the second polysilicon layer;
   patterning and etching the first and second polysilicon layers to define a lower capacitor plate;
   providing a layer of capacitor dielectric atop the roughened second polysilicon layer upper surface; and
   providing a layer of conductive material atop the capacitor dielectric to define an upper capacitor plate.

2. The method of forming a capacitor of claim 1 wherein the first thickness is from about 100 Angstroms to about 1000 Angstroms.

3. The method of forming a capacitor of claim 1 wherein the second thickness is from about 500 Angstroms to about 1500 Angstroms.

4. The method of forming a capacitor of claim 1 wherein the first thickness is from about 100 Angstroms to about 1000 Angstroms and the second thickness is from about 500 Angstroms to about 1500 Angstroms.

5. The method of forming a capacitor of claim 1 wherein,
the first thickness is from about 100 Angstroms to about 1000 Angstroms and the second thickness is from about 500 Angstroms to about 1500 Angstroms; and
the step of impinging laser energy onto the upper surface of the second polysilicon layer is conducted using an excimer laser.

6. The method of forming a capacitor of claim 1 wherein the step of impinging laser energy onto the upper surface of the second polysilicon layer is conducted using an excimer laser.

7. The method of forming a capacitor of claim 6 wherein the excimer laser comprises a XeCl laser.

8. The method of forming a capacitor of claim 1 wherein the step of impinging laser energy onto the upper surface of the second polysilicon layer comprises impinging laser energy in pulsed bursts of about 25 nanoseconds duration.

9. The method of forming a capacitor of claim 1 wherein the step of impinging laser energy onto the upper surface of the second polysilicon layer is conducted at a laser fluence of 0.5 J/cm$^2$ or greater.

10. The method of forming a capacitor of claim 9 wherein the first thickness is from about 100 Angstroms to about 1000 Angstroms and the second thickness is from about 500 Angstroms to about 1500 Angstroms.

11. The method of forming a capacitor of claim 1 wherein the step of impinging laser energy onto the upper surface of the second polysilicon layer is conducted at a laser fluence of from 0.5 J/cm$^2$ to 0.8 J/cm$^2$.

12. The method of forming a capacitor of claim 1 wherein the step of impinging laser energy onto the upper surface of the second polysilicon layer is conducted using an excimer laser in pulsed bursts of about 25 nanoseconds duration.

13. The method of forming a capacitor of claim 12 wherein the excimer laser comprises a XeCl laser.

14. The method of forming a capacitor of claim 1 wherein the step of impinging laser energy onto the upper surface of the second polysilicon layer is conducted using an excimer laser at a laser fluence of 0.5 J/cm$^2$ or greater.

15. The method of forming a capacitor of claim 14 wherein the excimer laser comprises a XeCl laser.

16. The method of forming a capacitor of claim 14 wherein the step of impinging laser energy onto the upper surface of the second polysilicon layer comprises impinging laser energy in pulsed bursts of about 25 nanoseconds duration.

17. The method of forming a capacitor of claim 14 wherein the step of impinging laser energy onto the upper surface of the second polysilicon layer is conducted at a laser fluence of from 0.5 J/cm$^2$ to 0.8 J/cm$^2$.

18. A method of forming a capacitor in semiconductor wafer processing comprising the following steps:
   providing a conductively doped first layer of polysilicon atop a semiconductor wafer to a thickness from 100 Angstroms to 1000 Angstroms;
   depositing an undoped second layer of polysilicon over the conductively doped first layer of polysilicon to a thickness of from 500 Angstroms to 1500 Angstroms, the layer of undoped polysilicon being deposited at a deposition temperature of at least 590° and having a smooth upper surface, said upper surface being smoother than upper surfaces of polysilicon deposited at temperatures less than 590° C.;

impinging laser energy onto the smooth upper surface of the second polysilicon layer with a XeCl excimer laser at a laser fluence of 0.5 J/cm$^2$ or greater and with pulsed bursts of about 25 nanoseconds duration to roughen the smooth upper surface and thereby increase the capacitance of the second polysilicon layer;

patterning and etching the first and second polysilicon layers to define a lower capacitor plate;

providing a layer of capacitor dielectric atop the roughened second polysilicon layer upper surface; and providing a layer of conductive material atop the capacitor dielectric to define an upper capacitor plate.

19. A method of forming a capacitor in semiconductor wafer processing comprising the following steps:

depositing a layer of polysilicon atop a wafer to a thickness from 500 Angstroms to 1000 Angstroms and at a deposition temperature of at least 590° C., the layer of polysilicon having a smooth upper surface, said upper surface being smoother than upper surfaces of polysilicon deposited at temperatures less than 590° C.;

impinging laser energy onto the smooth upper surface of polysilicon at a laser fluence of 0.3 J/cm$^2$ or greater to roughen the smooth upper surface and thereby increase the capacitance of the polysilicon layer;

ion implanting a conductivity enhancing material through the roughened upper polysilicon surface to impart conductivity to the polysilicon layer;

patterning and etching the polysilicon layer to define a lower capacitor plate;

providing a layer of capacitor dielectric atop the roughened polysilicon layer upper surface; and providing a layer of conductive material atop the capacitor dielectric to define an upper capacitor plates.

20. The method of forming a capacitor of claim 19 wherein the step of impinging laser energy onto the upper surface of the second polysilicon layer is conducted using an excimer laser.

21. The method of forming a capacitor of claim 20 wherein the excimer laser comprises a XeCl laser.

22. The method of forming a capacitor of claim 19 wherein the step of impinging laser energy onto the upper surface of the second polysilicon layer comprises impinging laser energy in pulsed bursts of about 25 nanoseconds duration.

23. The method of forming a capacitor of claim 19 wherein the step of impinging laser energy onto the upper surface of the second polysilicon layer is conducted at a laser fluence of 0.5 J/cm$^2$ or greater.

24. The method of forming a capacitor of claim 19 wherein the step of impinging laser energy onto the upper surface of the second polysilicon layer is conducted using an excimer laser in pulsed bursts of about 25 nanoseconds duration.

* * * * *